United States Patent [19]

Aoai et al.

[11] Patent Number: 4,904,563
[45] Date of Patent: Feb. 27, 1990

[54] MICROCAPSULES AND LIGHT-SENSITIVE RECORDING MATERIAL USING THE SAME

[75] Inventors: Toshiaki Aoai; Yoshimasa Aotani, both of Shizuoka, Japan

[73] Assignee: Fuji Photo Film Co., Ltd., Kanagawa, Japan

[21] Appl. No.: 49,366

[22] Filed: May 14, 1987

[30] Foreign Application Priority Data

May 14, 1986 [JP] Japan .................... 61-109747

[51] Int. Cl.⁴ .............. B01J 13/02; B32B 27/34; G03C 1/72
[52] U.S. Cl. ................... 430/138; 430/270; 428/402.2; 428/402.21; 428/402.22; 428/402.24
[58] Field of Search .............. 430/138, 270; 428/402.2, 402.21, 402.22, 402.24

[56] References Cited

U.S. PATENT DOCUMENTS

| 4,399,209 | 10/1984 | Sanders et al. | 430/138 |
| 4,501,809 | 2/1985 | Hiraishi et al. | 430/138 |
| 4,551,407 | 11/1985 | Sanders et al. | 430/138 |
| 4,689,289 | 8/1987 | Crivello | 430/270 |
| 4,752,552 | 6/1988 | Aoai | 430/192 X |
| 4,766,037 | 8/1988 | Watanabe et al. | 428/321.5 X |
| 4,786,577 | 11/1988 | Aoai et al. | 430/192 |
| 4,816,375 | 3/1989 | Aoai | 430/192 X |
| 4,820,607 | 4/1989 | Aoai | 430/192 X |

FOREIGN PATENT DOCUMENTS 88739  7/1983  Japan .

Primary Examiner—Paul R. Michl
Assistant Examiner—Cynthia Hamilton
Attorney, Agent, or Firm—Sughrue, Mion, Zinn, Macpeak & Seas

[57] ABSTRACT

Microcapsules are disclosed containing (a) a vinyl compound which has at least two polymerizable, ethylenically unsaturated groups linked to each other through a linking group comprising a chemical bond capable of being split by the action of an acid, (b) a thermal polymerization initiator, and (c) one or more compounds capable of producing acid when irradiated with actinic radiation.

A light-sensitive recording material is also disclosed, which has on its support the above-described microcapsules or a thermally cured product thereof.

17 Claims, No Drawings

MICROCAPSULES AND LIGHT-SENSITIVE RECORDING MATERIAL USING THE SAME

FIELD OF THE INVENTION

This invention relates to microcapsules and a light-sensitive recording material using same, and, more particularly, to microcapsules containing a specific composition of core materials and to a light-sensitive material using the microcapsules.

BACKGROUND OF THE INVENTION

Many studies have been conducted on recording systems using capsules, and many systems, such as pressure-sensitive recording systems and heat-sensitive recording systems have so far been developed.

The art teaches various embodiments described, for example, in U.S. Pat. Nos. 2,712,507, 2,730,456, 2,730,457, 3,418,250, 3,432,327, etc. In the prior arts, there is a disadvantage that record responding to light as is in the present invention has not been made, although record responding to pressure and heat has been made.

Attempts have also been made to prepare recording materials using capsules whose capsule wall is made of a light-sensitive high polymer. However, as is well known, since the thickness of a capsule wall is as thin as not more than 100 $\mu$m, and yet some wall strength is essentially necessary, recording materials which utilize change in capsule wall strength caused by crosslinking reaction fundamentally involve difficult problems.

Japanese Patent Application (OPI) Nos. 124343/82 and 88739/83 (the term "OPI" as used herein means an "unexamined published application") describe microcapsules containing a photocurable composition which comprises a vinyl compound and a photopolymerization initiator. These relate to recording materials utilizing differences in the curing degree caused by imagewise exposure, to thereby cure microcapsules in exposed areas. However, such microcapsules have the defect that they are susceptible to pressure, to form fog during storage with time before being exposed, i.e., in a non-cured state.

Furthermore, U.S. Pat. No. 4,551,407 discloses microcapsules containing a composition which comprises a photo-decomposable polymer. The microcapsules basically utilize a change in viscosity of the internal phase, caused by decomposition of the polymer contained in the microcapsules in exposed areas through imagewise exposure. In this case, however, pressure fog occurring during storage before use is not satisfactorily prevented.

SUMMARY OF THE INVENTION

An object of the present invention is to provide novel microcapsules which solve the above-described problems and to provide a recording material using them. That is, objects of the present invention include providing novel microcapsules which respond to light and which have an excellent preservability with time, and to providing a recording material using them.

As a result of extensive investigations to attain the above-described objects, the inventors have found that the above-described objects can be attained by using novel microcapsules containing a specific combination of core materials, and thus have achieved the present invention.

That is, the present invention provides:

(1) microcapsules containing (a) a vinyl compound which has at least two polymerizable, ethylenically unsaturated groups linked to each other through a linking group comprising a chemical bond capable of being split by the action of an acid, (b) a thermal polymerization initiator, and (c) one or more compounds capable of producing acid when irradiated with actinic radiation; and (2) a light-sensitive recording material which comprises a support having provided thereon microcapsules containing (a) a vinyl compound which has at least two polymerizable, ethylenically unsaturated groups linked to each other through a linking group comprising a chemical bond capable of being split by the action of an acid, (b) a thermal polymerization initiator, and (c) one or more compounds capable of producing an acid when irradiated with actinic radiation, or a thermally cured product of said microcapsules.

DETAILED DESCRIPTION OF THE INVENTION

In the microcapsules of the present invention, the vinyl compound retained therein is first thermally cured by heating upon formation of the microcapsules, or after formation and before application of the microcapsules onto a support, or after such application. Since the thermally cured microcapsules are highly crosslinked, they are resistant to fog formation. The thus thermally cured microcapsules are imagewise exposed in a state of being carried on the support to produce an acid in an internal phase of the microcapsules in exposed areas, and the acid in turn dissociates the crosslinkage in the thermally cured product of the internal phase of the microcapsules. As a result, microcapsules in exposed areas can be ruptured by application of less pressure than the pressure required to rupture microcapsules in unexposed areas. The present invention utilizes the difference in the curing degree between exposed areas and unexposed areas caused by the above-described dissociation with acid.

For example, where the internal phase of microcapsules contains a color-forming material, rupture of microcapsules in exposed areas in the presence of a color developer leads to formation of dye image. That is, the present invention provides a negative-working recording material. Rupture of microcapsules in exposed areas is conducted mainly by application of pressure, but means other than the application of pressure, for example, application of heat to melt the wall of microcapsules, may also be used.

The chemical bond in the vinyl compound (a) to be dissociated by the action of acid includes an acetal bond, a amidoacetal bond, an orthoester bond, a vinyl ether bond, a silyl ester bond, a silyl ether bond, a N-acylimino carbonic acid bond, a carbonic acid bond, a cumyl ester bond, a trityl ester bond, a silyl-oximether bond, a borate bond, etc., with a silyl ester bond and a silyl ether bond being preferable.

More preferable examples of the vinyl compound to be used as (a) in the present invention are those compounds which are represented by formula (I) or (II)

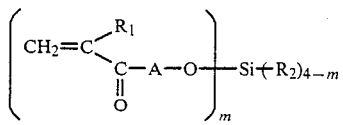  (I)

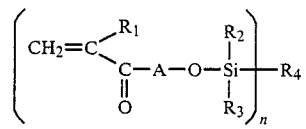  (II)

wherein

R₁ represents a hydrogen atom, a halogen atom, or an unsubstituted or substituted alkyl group, preferably a hydrogen atom or an unsubstituted or substituted alkyl group, and more preferably a hydrogen atom or a methyl group;

$R_2$ and $R_3$ each represents a hydrogen atom, an unsubstituted or substituted alkyl, alkenyl, aryl, or aralkyl group, or —OR₅, and preferably an unsubstituted or substituted alkyl, aryl, or aralkyl group;

$R_4$ represents an unsubstituted or substituted n-valent aliphatic or aromatic hydrocarbon;

$R_5$ represents an unsubstituted or substituted alkyl, aryl or aralkyl group, preferably an alkyl group containing from 1 to 8 carbon atoms or an aryl group containing from 6 to 15 carbon atoms;

A represents a single chemical bond,

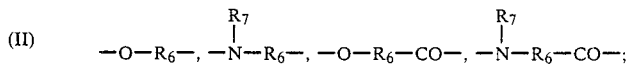

$R_6$ represents an unsubstituted or substituted divalent aliphatic or aromatic hydrocarbon;

$R_7$ represents a hydrogen atom, an unsubstituted or substituted alkyl, aryl or aralkyl group, or —CO—R₈, preferably a hydrogen atom, an alkyl group containing from 1 to 4 carbon atoms, or —CO—R₈;

$R_8$ represents an unsubstituted or substituted alkyl, aryl or aralkyl group, and preferably represents an alkyl group containing from 1 to 4 carbon atoms or an aryl group containing from 6 to 10 carbon atoms;

m represents an integer of from 2 to 4; and n represents an integer of 2 or more.

In formula (I) wherein m=2, the two R₂ groups may be the same or different.

Specific examples of the vinyl compounds that can be used according to the present invention that are represented by formula (I) or (II) include the following.

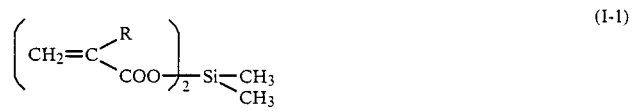  (I-1)

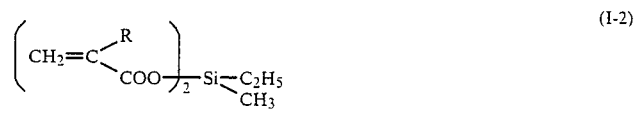  (I-2)

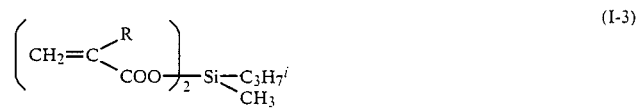  (I-3)

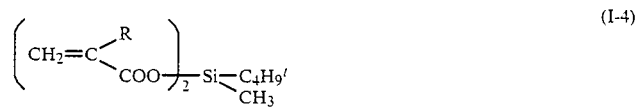  (I-4)

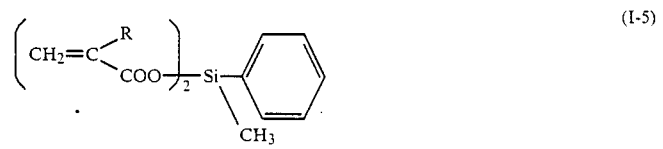  (I-5)

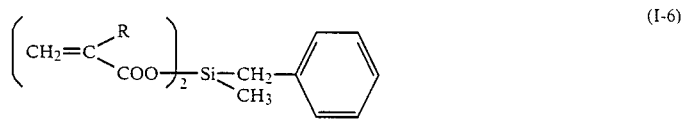  (I-6)

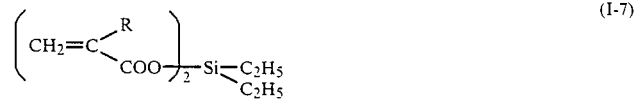  (I-7)

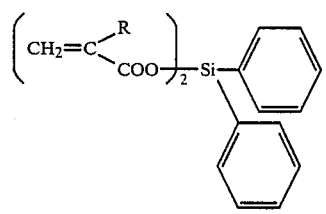 (I-8)
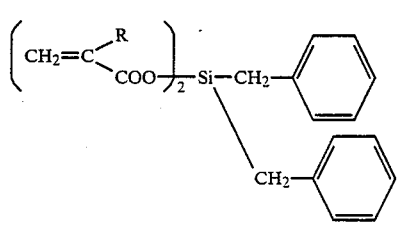 (I-9)
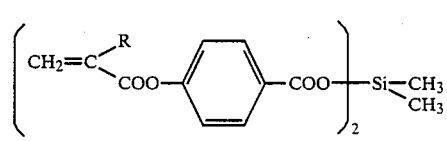 (I-10)
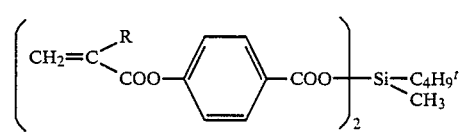 (I-11)
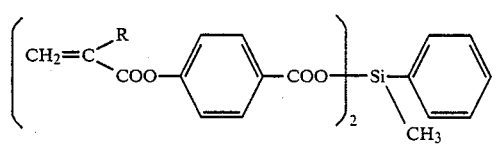 (I-12)
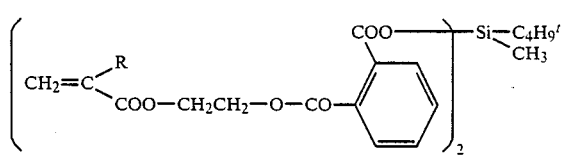 (I-13)
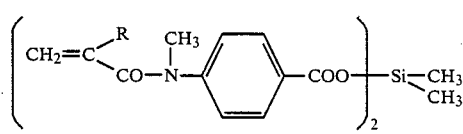 (I-14)
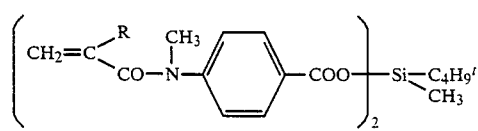 (I-15)
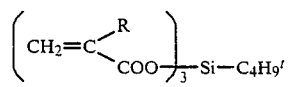 (I-16)
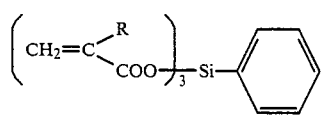 (I-17)

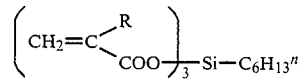 (I-18)
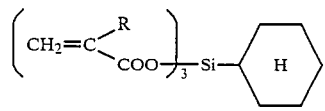 (I-19)
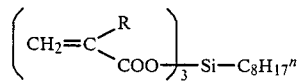 (I-20)
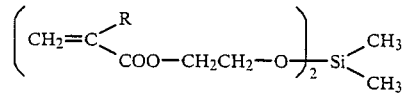 (I-21)
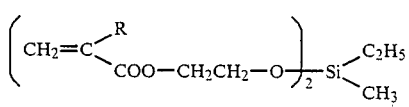 (I-22)
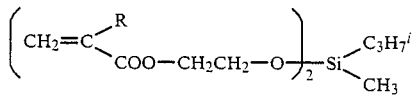 (I-23)
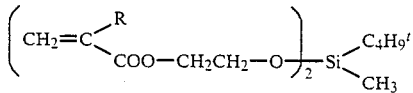 (I-24)
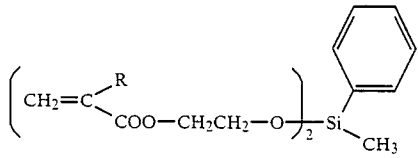 (I-25)
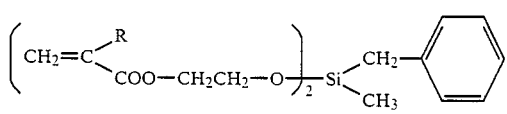 (I-26)
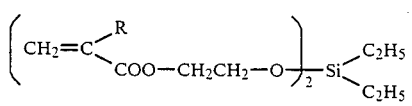 (I-27)
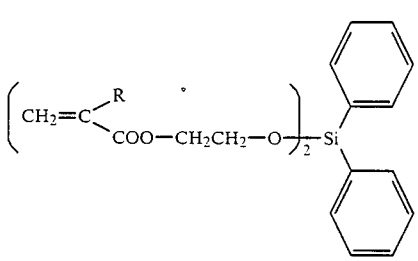 (I-28)
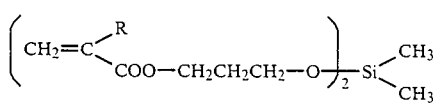 (I-29)

-continued
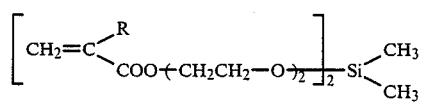
(I-30)
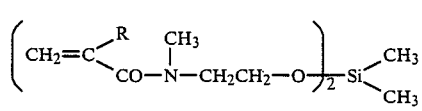
(I-31)
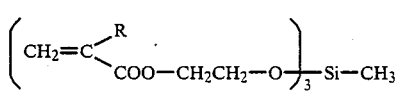
(I-32)
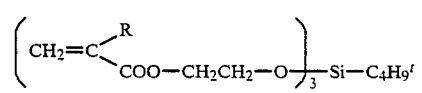
(I-33)
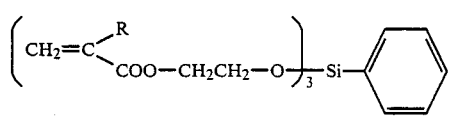
(I-34)
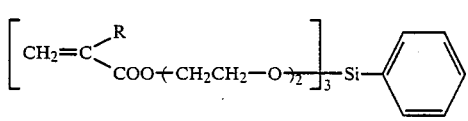
(I-35)
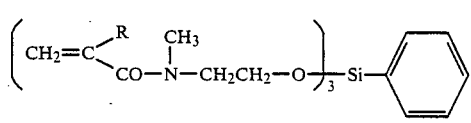
(I-36)
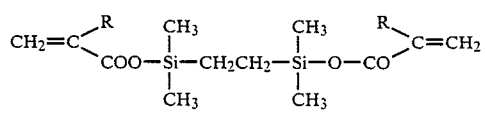
(II-1)
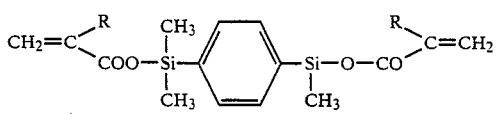
(II-2)
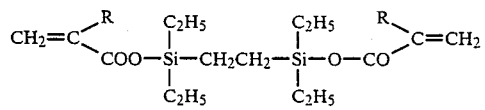
(II-3)
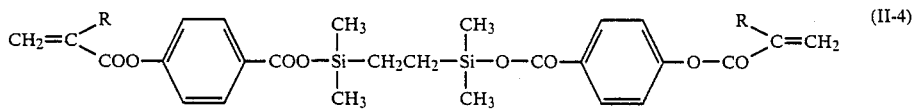
(II-4)
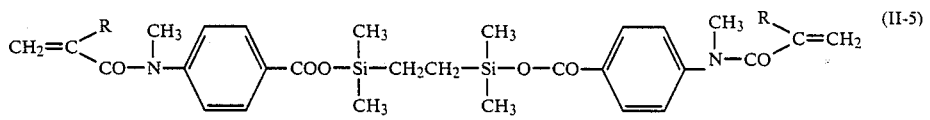
(II-5)
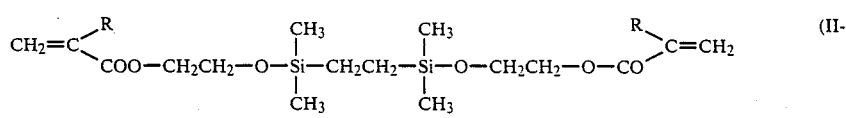
(II-6)

-continued

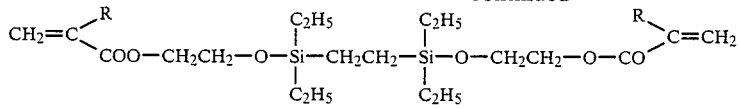 (II-7)

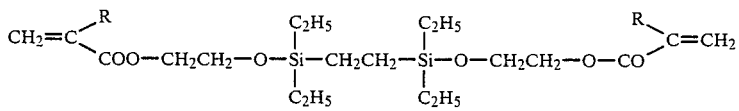 (II-8)

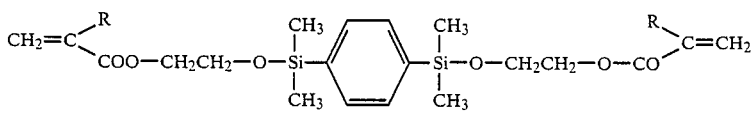 (II-9)

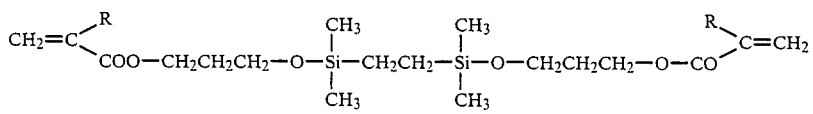 (II-10)

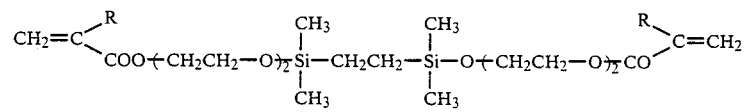 (II-11)

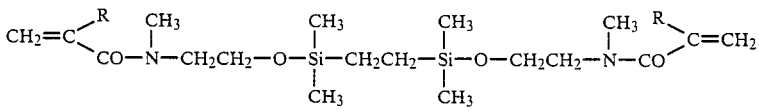 (II-12)

Additionally, R in the above specific examples represents a hydrogen atom or a methyl group.

The vinyl compounds to be used as a component (a) in the present invention may be used as a combination of two or more thereof. Other vinyl compounds having an ethylenically unsaturated group or groups may be allowed to coexist for the purpose of adjusting the curing degree. The ratio of the vinyl compounds to be used as a component (a) and other vinyl compounds which coexist with the vinyl compounds of a component (a) is preferably 100/0 to 5/95, more preferably from 100/0 to 40/60. Such vinyl compounds include, for example, those compounds which have one addition-polymerizable unsaturated bond, selected from among acrylates, acrylamides, methacrylates, methacrylamides, allyl compounds, vinyl ethers, vinyl esters, styrenes, crotonic acids esters, itaconic acid esters, maleic acid esters, fumaric acid esters, acrylic acid, methacrylic acid, acrylonitrile, methacrylonitrile, etc. Specifically, acrylates include, for example, alkyl acrylates (containing from 1 to 10 carbon atoms in the alkyl moiety) (e.g., methyl acrylate, ethyl acrylate, propyl acrylate, butyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythrithol monoacrylate, glycidyl acrylate, benzyl acrylate, methoxybenzyl acrylate, furfuryl acrylate, tetrahydrofurfuryl acrylate, etc.) and aryl acrylates (e.g., phenyl acrylate, etc.). Methacrylates include, for example, alkyl methacrylates (preferably containing from 1 to 10 carbon atoms in the alkyl moiety) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl meth- acrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.) and aryl methacrylates (e.g., phenyl methacrylate, cresyl methacrylate, naphthyl methacrylate, etc.). Acrylamides include, for example, acrylamide, N-alkylacrylamides (the alkyl moiety containing, for example, from 1 to 10 carbon atoms, and including, for example, a methyl group, an ethyl group, a propyl group, a butyl group, a t-butyl group, a heptyl group, an octyl group, a cyclohexyl group, a benzyl group, a hydroxyethyl group, a benzyl group, etc.), N-arylacrylamides (the aryl moiety being exemplified by a phenyl group, a tolyl group, a nitrophenyl group, a naphthyl group, a cyanophenyl group, a hydroxyphenyl group, etc.), N,N-dialkylacrylamides (the alkyl moiety containing, for example, from 1 to 10 carbon atoms, and including, for example a methyl group, an ethyl group, a butyl group, an isobutyl group, an ethylhexyl group, a cyclohexyl group, etc.), N,N-diarylacrylamides (the aryl moiety being exemplified by a phenyl group), N-methyl-N-phenylacrylamide, N-hydroxyethyl-N-methylacrylamide, N-2-acetamidoethyl-N-acetylacrylamide, etc. Methacrylamides include methacrylamide, N-alkylmethacrylamides (the alkyl moiety containing, for example, from 1 to 10 carbon atoms, and including, for example, a methyl group, an ethyl group, a t-butyl group, an ethylhexyl group, a hydroxyethyl group, a cyclohexyl group, etc.), N-aryl-methacrylamides (the aryl moiety being exemplified by a phenyl group and a hydroxyphenyl group), N,N-dialkylmethacrylamides (the alkyl moiety being exemplified by an ethyl group, a propyl group and a butyl group), N,N-diarylmethacrylamides (the aryl moiety being exemplified by a phenyl group), N-hydroxyethyl-N-methylmethacrylamide, N-methyl-N-phenylmethacrylamide, N-ethyl-N- phenylmethacrylamide, etc. Allyl compounds include, for example, allyl esters (e.g., allyl acetate, allyl caproate, allyl caprylate, allyl laurate, allyl palmitate, allyl stearate, allyl benzoate, allyl acetoacetate, allyl lactate, etc.), allyloxyethanol, etc. Vinyl ethers include alkylvinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ethers, 2-ethylbutyl vinyl ether, hydroxyethyl vinyl ether, diethyleneglycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (e.g., vinyl phenyl ether, vinyl tolyl ether, vinyl chlorophenyl ether, vinyl 2,4-dichlorophenyl ether, vinyl naphthyl ether, vinyl anthranyl ether, etc.), etc. Vinyl esters include, for example, vinyl butyrate, vinyl isobutyrate, vinyl trimethylacetate, vinyl diethylacetate, vinyl valeate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl $\beta$-phenylbutyrate, vinyl cyclohexylcarboxylate, vinyl benzoate, vinyl salicylate, vinyl chlorobenzoate, vinyl tetrachlorobenzoate, vinyl naphthoate, etc. Styrenes include, for example, styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.), alkoxystyrenes (e.g., methoxystyrene, 4-methoxy-3-methylstyrene, dimethoxystyrene, etc.), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluromethylstyrene, 4-fluoro-3-trifluoromethylstryene, etc.), etc. Crotonic acid esters include, for example, alkyl crotonates (e.g., butyl crotonate, hexyl crotonate, glycerin monocrotonate, etc.). Further, dialkyl itaconates (e.g., dimethyl itaconate, diethyl itaconate, dibutyl itaconate, etc.), dialkyl esters of maleic acid or fumaric acid (e.g., dimethyl maleate, dibutyl fumarate, etc.), acrylic acid, methacrylic acid, acrylonitrile, methacrylonitrile, etc. are also illustrated as the specific examples of the other vinyl compounds.

In addition, those vinyl compounds which have in the molecule a group capable of generating an acid upon being irradiated with actinic radiation can also be used. Further, polyfunctional vinyl compounds having two or more ethylenically unsaturated groups are also included. Examples include polyethyleneglycol diacrylate or dimethacrylate, polypropylene glycol diacrylate or dimethacrylate, trimethylolethane triacrylate or trimethacrylate, neopentylglycol diacrylate or dimethacrylate, pentaerythritol triacrylate or trimethacrylate, pentaerythritol tetraacrylate or tetramethacrylate, dipentaerythritol hexaacrylate or hexamethacrylate, hexanediol diacrylate or dimethacrylate, tri(acryloyloxyethyl) isocyanurate, those which are prepared by adding ethylene oxide or propylene oxide to a polyhydric alcohol (e.g., glycerin or trimethylolpropane) and acrylating or methacrylating the addition product, urethane acrylates as described in Japanese Patent Publication Nos. 41708/73, 6034/75, and Japanese Patent Application (OPI) No. 37193/76, polyester acrylates described in Japanese Patent Application (OPI) No. 64183/73, Japanese Patent Publication Nos. 43191/84 and 30490/77, and polyfunctional acrylates or methacrylates such as epoxy acrylates prepared by reacting epoxy resin with acrylic or methacrylic acid. Still further, those which are shown in *Journal of Japanese Adhesive Association*, Vol. 20, No. 7, pp. 300 to 308 as photo-curable monomers and oligomers may be used as well.

The amount of the vinyl compound to be used as component (a) in the present invention including the above-described vinyl compound is from 5 to 99 wt %, preferably from 20 to 90 wt %, of the internal phase of the microcapsules.

As the thermal polymerization initiator to be used as component (b) in the present invention, any of those which can initiate polymerization upon being heated may be used. Preferably examples thereof include azo compounds (e.g., 2,2'-azobisisobutyronitrile, 2,2'-azobis(4-methoxy-2,4-dimethylvaleronitrile), 2,2'-azobis(2,4-dimethylvaleronitrile), 2,2'-azobis(2-methylbutyronitrile), 2,2'-azobis(2,4,4-trimethylpentane), 2,2'-azobis(2-methylpropane), (1-phenylethyl)azodiphenylmethane, dimethyl 2,2'-azobisisobutyrate, 1,1'-azobis(1-cyclohexanecarbonitrile), 2-carbamoylazo)-isobutyronitrile, 2-phenylazo-2,4-dimethyl-4-methoxyvaleronitrile, 2,2'-azobis(N,N'-dimethyleneisobutylamidine), 2,2'-azobis(2-amidinopropane) dihydrochloride, 4,4'-azobis(4-cyanopentanoic acid), 2,2'-azobis(isobutylamide), 2,2'-azobis(2-methyl-N-(2-hydroxyethyl)propionamide), 2,2'-azobis(2-methyl-N-[1,1-bis(hydroxymethyl)ethyl]propionamide), 2,2'-azobis(2-methyl-N-(1,1-bis(hydroxymethyl)-2-hydroxyethyl)propionamide), etc.) and peroxide compounds (e.g., diisopropyl peroxydicarbonate, 2,4-dichlorobenzoyl peroxide, t-butyl peroxypivalate, oxtanoyl peroxide, stearoyl peroxide, lauroyl peroxide, acetyl peroxide, t-butyl peroxyisobutyrate, benzoyl peroxide, cyclohexanone peroxide, t-butyl peroxyisopropylcarbonate, di-t-butyl diperoxyphthalate, t-butyl peroxyacetate, 2,5-dimethyl-2,5-di(benzoylperoxy)-hexane, t-butyl peroxylaurate, t-butyl peroxybenzoate, dicumyl peroxide, 2,5-dimethyl-2,5-di(t-butylperoxy)hexane, t-butyl hydroperoxide, methyl ethyl ketone peroxide, di-t-butyl peroxide, 2,5-dimethyl-2,5-di(t-butylperoxy)hexane, diisopropylbenzene hydroperoxide, p-menthane hydroperoxide, pinane hydroperoxide, cumene hydroperoxide, 2,5-dimethylhexane-2,5-dihydroperoxide, etc.).

These thermal polymerization initiators are generally used in an amount of from 0.01 to 10 wt %, and preferably from 0.1 to 5 wt %, based on weight of vinyl compound. In addition, thermal polymerization inhibitors may be used for adjusting thermally curing properties.

Compounds which can produce an acid by irradiation with actinic radiation and which can be used as a component (c) in the present invention include many known compounds and mixtures such as salts of diazonium, phosphonium, sulfonium or iodonium with $BF_4^-$, $PF_6^-$, $SbF_6^-$, $SiF_6^-$, $ClO_4^-$, etc., organic halogen compounds, o-quinonediazidosulfonyl chloride, and combinations of an organometallic compound and an organic halogen compound. Compounds which can produce an acid by photo-decomposition, such as those described in U.S. Pat. No. 3,779,778 and West German Pat. No. 2,610,842, are also suitable. Further, compounds which are described, for example, in Japanese Patent Application (OPI) Nos. 77742/80 and 163234/82, may also be used.

Of the above-described compounds capable of producing an acid by photo decomposition, typical compounds are described below.

(1) Trihalomethyl group-substituted oxidiazole derivatives represented by formula (III) or s-triazine derivatives represented by formula (IV).

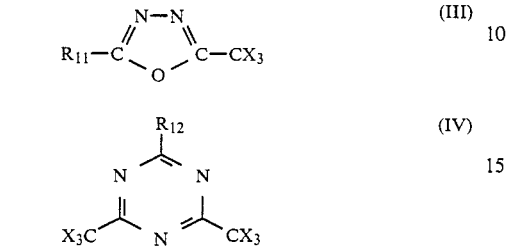

wherein $R_{11}$ represents a substituted or unsubstituted aryl or alkenyl group, $R_{12}$ represents $R_{11}$, $-CX_3$, or a substituted or unsubstituted alkyl group, and X represents a chlorine atom or a bromine atom.

Specific examples are illustrated below.

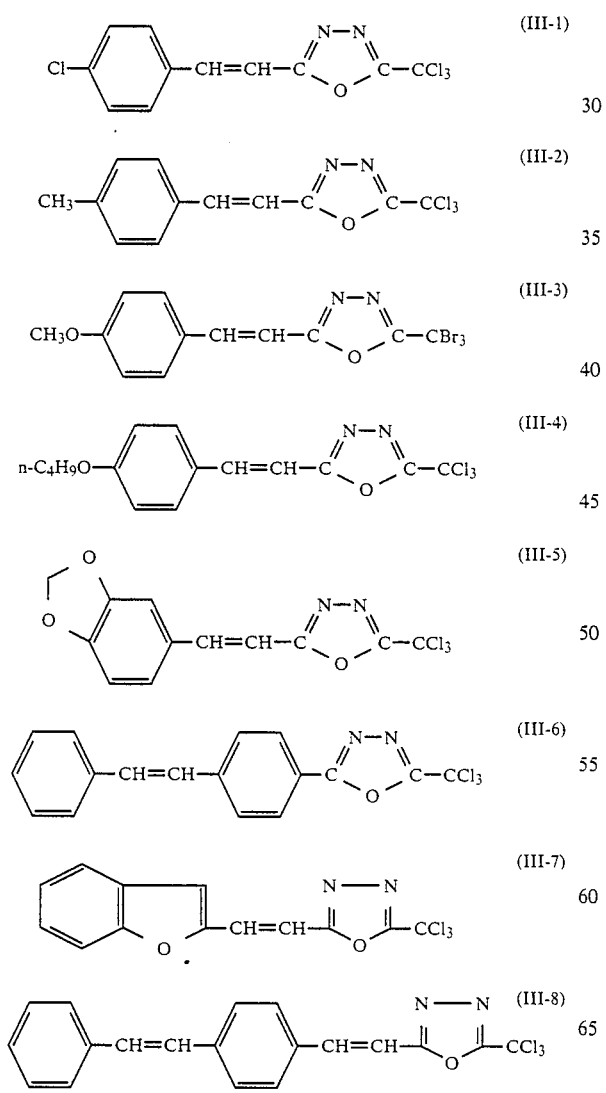

-continued

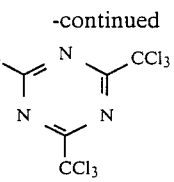 (IV-1)

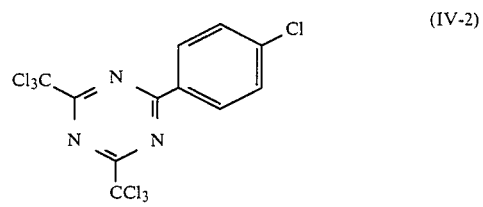 (IV-2)

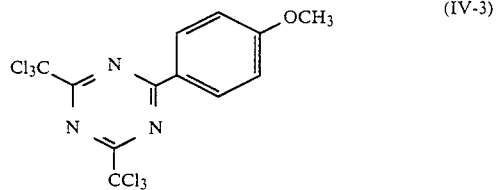 (IV-3)

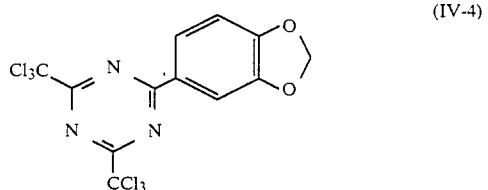 (IV-4)

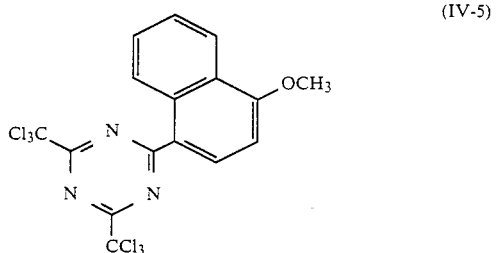 (IV-5)

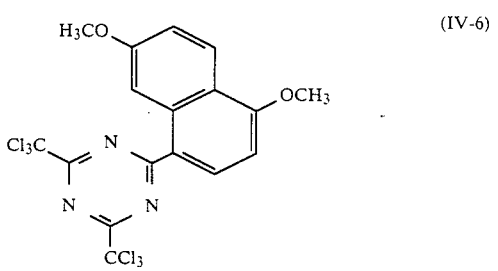 (IV-6)

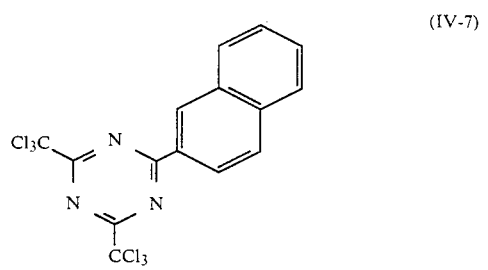 (IV-7)

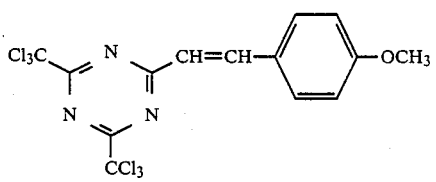
(IV-8)

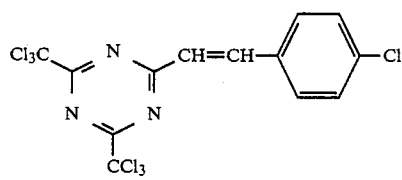
(IV-9)

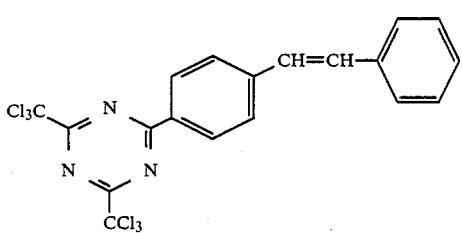
(IV-10)

(2) Indonium salts represented by formula (V) or sulfonium salts represented by formula (VI)

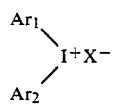
(V)

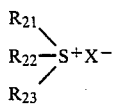
(VI)

wherein $Ar_1$ and $Ar_2$, which may be the same or different, each represents a substituted or unsubstituted aromatic group, $R_{21}$, $R_{22}$, and $R_{23}$, which may be the same or different, each represents a substituted or unsubstituted alkyl group or aromatic group, and $X^-$ represents $BF_6^-$, $PF_6^-$, $AsF_6^-$, $SbF_6^-$ or $ClO_4^-$.

Two of $R_{21}$, $R_{22}$, and $R_{23}$ or $Ar_1$ and $Ar_2$ may be bound to each other through a chemical bond or a divalent substituent thereof. The divalent substituent includes preferably an alkylene group, an arylene group, an ether group, etc., more preferably an alkylene group having from 1 to 8 carbon atoms, an arylene group having from 6 to 10 carbon atoms and ether group.

Examples of compounds represented by formula (V) include, for example, those compounds which are described in Japanese Patent Application (OPI) Nos. 158680/75 and 100716/76, and Japanese Patent Publication No. 14277/77. Examples of compounds represented by formula (VI) include, for example, those compounds which are described in Japanese Patent Application (OPI) No. 56885/76, Japanese Patent Publication No. 14278/77, U.S. Pat. No. 4,442,197, and West German Pat. No. 2,904,626.

Specific examples thereof are shown below.

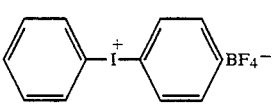
(V-1)

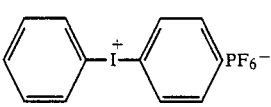
(V-2)

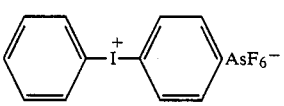
(V-3)

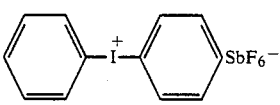
(V-4)

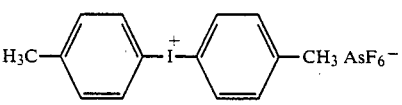
(V-5)

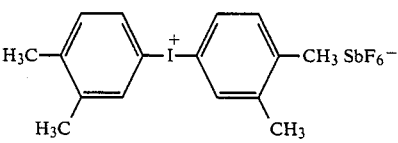
(V-6)

-continued
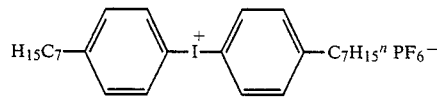 (V-7)
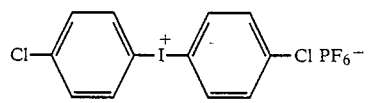 (V-8)
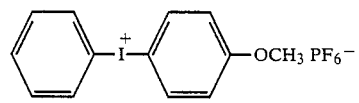 (V-9)
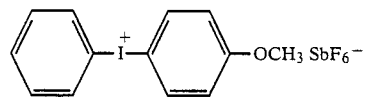 (V-10)
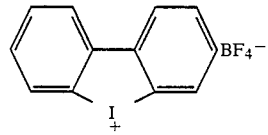 (V-11)
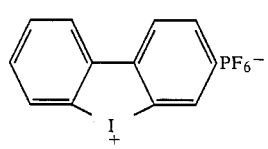 (V-12)
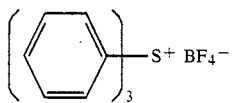 (VI-1)
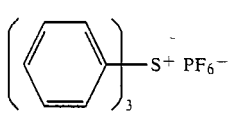 (VI-2)
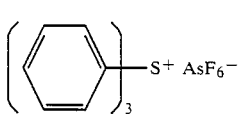 (VI-3)
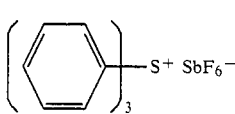 (VI-4)
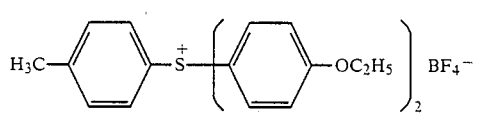 (VI-5)
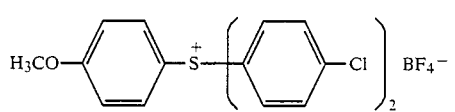 (VI-6)

-continued
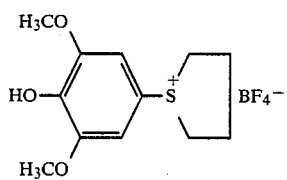 (VI-7)
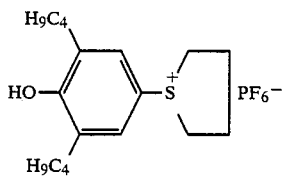 (VI-8)
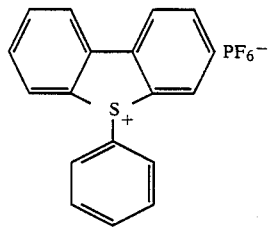 (VI-9)
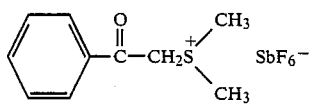 (VI-10)
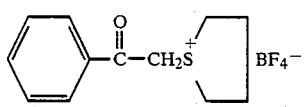 (VI-11)
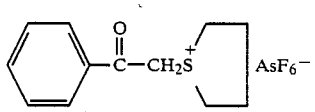 (VI-12)
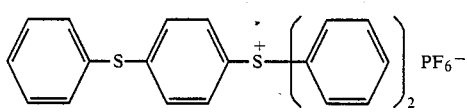 (VI-13)
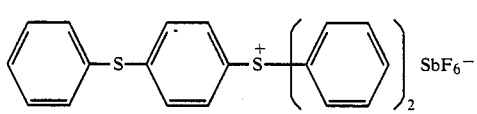 (VI-14)
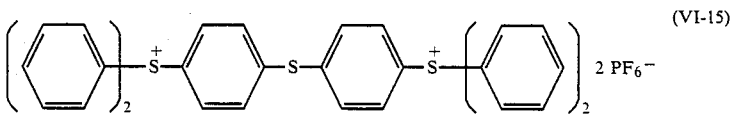 (VI-15)
(3) Disulfone derivatives represented by formula (VII) or imidosulfonate derivatives represented by formula (VIII)
$$Ar_{11}-SO_2-SO_2-Ar_{12} \quad (VII)$$
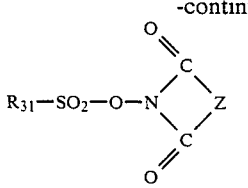 (VIII)
wherein $Ar_{11}$ and $Ar_{12}$, which may be the same or different, each represents a substituted or unsubstituted aryl group, $R_{31}$ represents a substituted or unsubstituted alkyl or aryl group, and Z represents a substituted or unsubstituted alkylene, alkenylene, or arylene group.
Specific examples thereof are illustrated below.
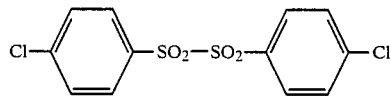 (VII-1)
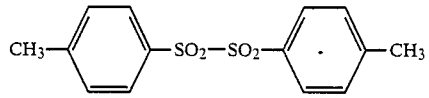 (VII-2)
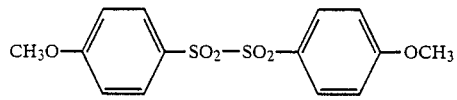 (VII-3)
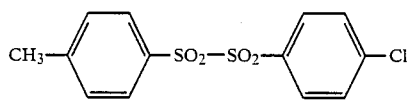 (VII-4)
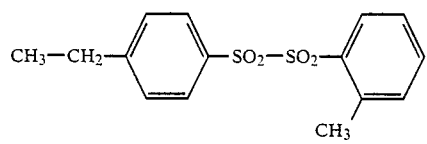 (VII-5)
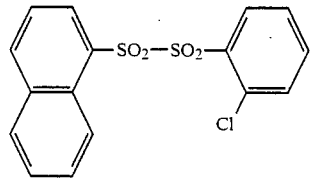 (VII-6)
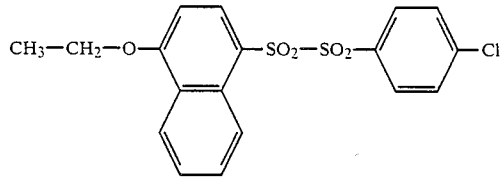 (VII-7)
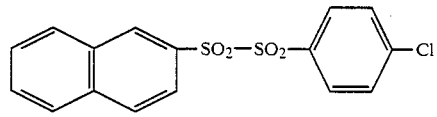 (VII-8)
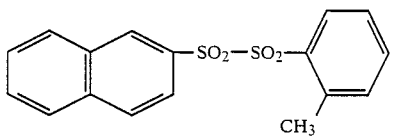 (VII-9)
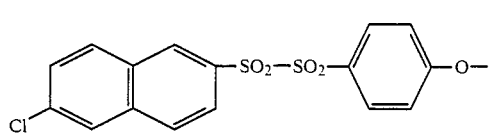 (VII-10)
-continued
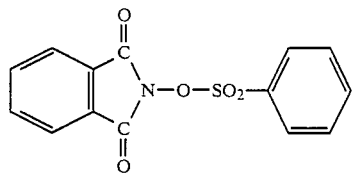 (VIII-1)
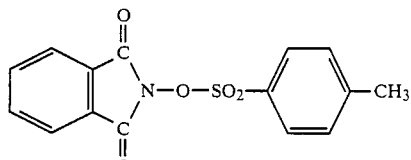 (VIII-2)
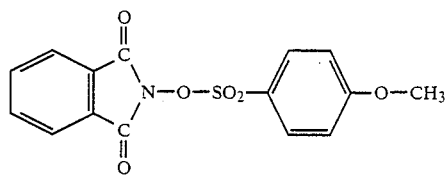 (VIII-3)
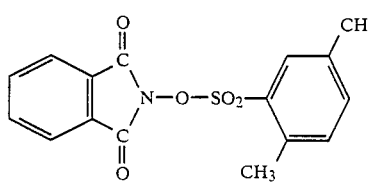 (VIII-4)
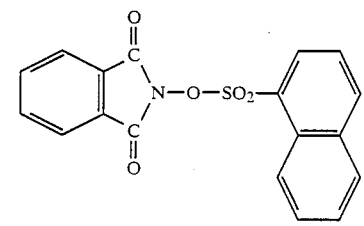 (VIII-5)
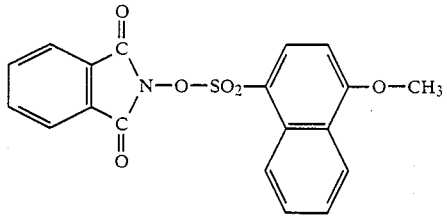 (VIII-6)
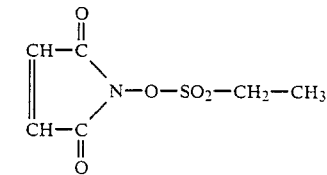 (VIII-7)
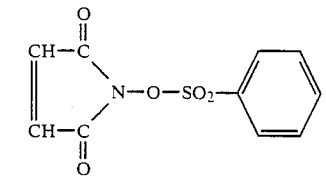 (VIII-8)

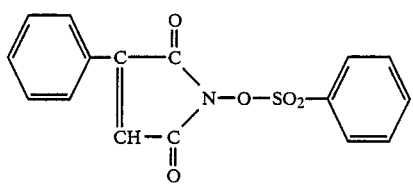 (VIII-9)

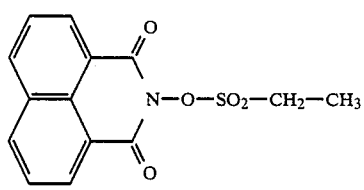 (VIII-10)

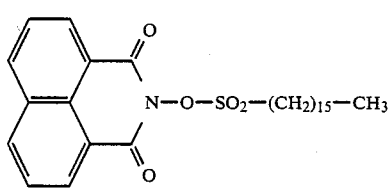 (VIII-11)

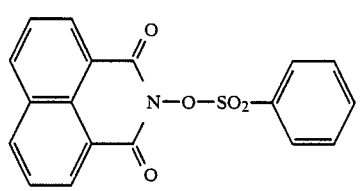 (VIII-12)

(4) Diazonium salts represented by formula (IX)

$$Ar_{21}-N_2^+Y^- \quad (IX)$$

wherein $Ar_{21}$ represents a substituted or unsubstituted aromatic group, $Y^-$ represents an organic carboxylate anion, an organic sulfonate anion, an organic sulfate anion, $BF_4^-$, $PF_6^-$, $AsF_6^-$, $SbF_6^-$, or $ClO_4^-$.

Specific examples thereof are illustrated below.

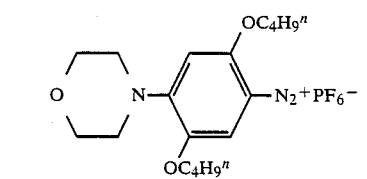 (IX-1)

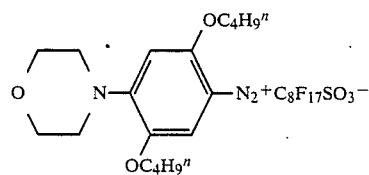 (IX-2)

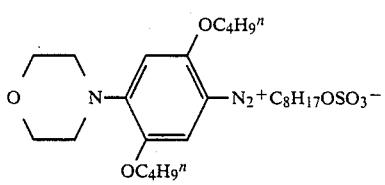 (IX-3)

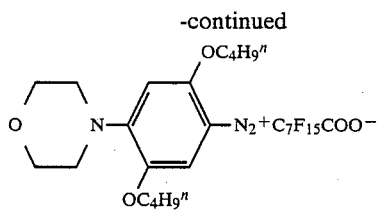 (IX-4)

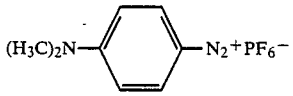 (IX-5)

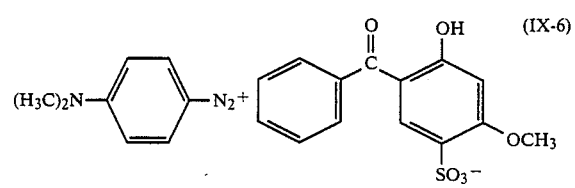 (IX-6)

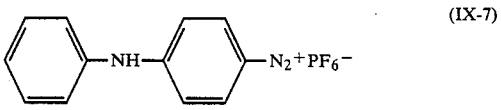 (IX-7)

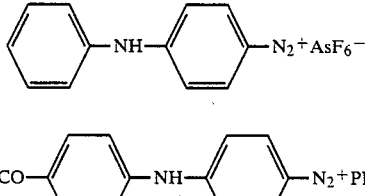 (IX-8)

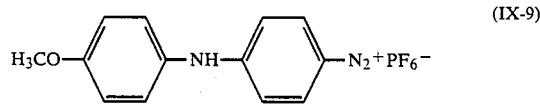 (IX-9)

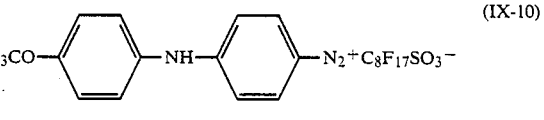 (IX-10)

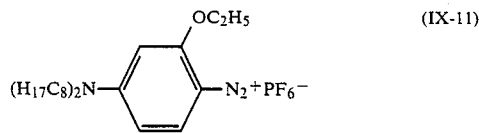 (IX-11)

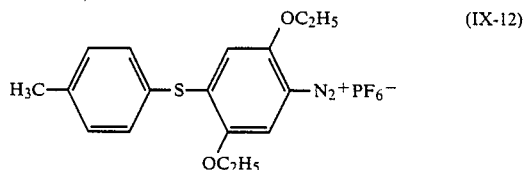 (IX-12)

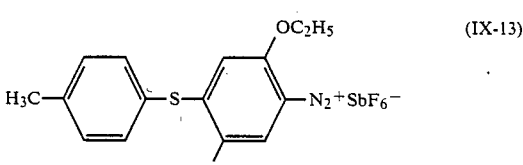 (IX-13)

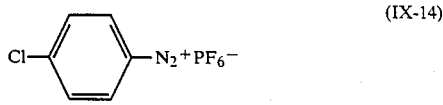 (IX-14)

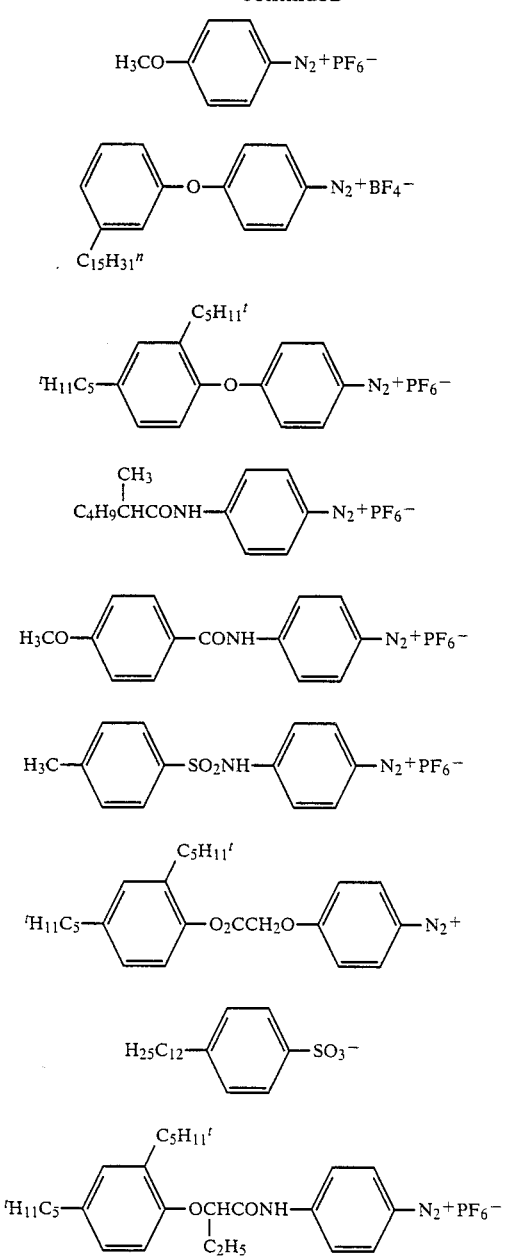

The amount of the compound(s) capable of producing an acid by photo-decomposition which is to be used as a component (c) in the present invention is generally from 0.0001/1 to 10/1, and preferably from 0.01/1 to 2/1, in molar ratio based on the molar content of vinyl compound (a).

If desired, sensitizer compounds which increase the efficiency of photo-decomposing the above-described compound capable of producing an acid by the photo-decomposition (so-called sensitizers) may be incorporated in the organic internal phase of the microcapsules of the present invention.

Such sensitizers include, for example, those compounds such as those described in U.S. Pat. Nos. 4,250,053 and 4,442,197 for the acid-producing agents represented by formula (V) or (VI). Specific examples thereof include anthracene, phenanthrene, perylene, pyrene, chrysene, 1,2-benzanthracene, coronene, 1,6-diphenyl-1,3,5-hexatriene, 1,1,4,4-tetraphenyl-1,3-butadiene, 2,3,4,5-tetraphenylfuran, 2,5-diphenylthiophene, thioxanthone, 2-chlorothioxanthone, phenothiazine, 1,3-diphenylpyrazoline, 1.3-diphenylisobenzofuran xanthone, benzophenone, 4-hydroxybenzophenone, anthrone, ninhydrin, 9-fluorenone, indanone, phenanthraquinone, tetralone, 7-methoxy-4-methylcoumarin, 3-keto-bis(7-diethylaminocoumarin), Michler's ketone, etc.

The ratio of the sensitizer to the compound (c) capable of producing acid by photo-decomposition generally ranges from 0.01/1 to 20/1, and preferably from 0.1 to 5/1, in molar ratio.

In order to more raise the efficiency of acid production, hydrogen donors such as mercapto compounds, phenol compounds, etc., may be mixed as well as N-phenylglycine.

The internal phase of the present invention may contain a carrier oil. Preferable carrier oils are weakly polar solvents having a boiling point of above 170° C., preferably from 180° to 300° C. Typical examples of the carrier oil to be used in the present invention include those which are commonly used for production of carbonless paper. Such oils are generally characterized by the capability of disolving Crystal Violet lactone in a concentration of 0.5 wt % or more. However, such carrier oils are not always necessary. Examples of the carrier oils that can be used in the present invention include alkylated biphenyls (e.g., monoisopropybiphenyl, etc.), polychlorobiphenyls, castor oil, mineral oil, deodorized kerosene, naphthenic mineral oil, dibutyl phthalate, dibutyl fumarate, brominated paraffin, and mixtures thereof. Of these, alkylated biphenyls generally have low toxicity, and thus are preferable.

In addition, organic solvents having a proper polarity may also be used for the purpose of adjusting solubility of the composition encapsulated in the microcapsules of the present invention.

The light-sensitive recording material using the microcapsules of the present invention and having the above-described construction can provide a polymer image by dissociation of the thermally cured vinyl compound, and, in addition, can provide a color image by incorporating a color image-forming material as an optional ingredient in the core material of the microcapsules.

The color image-forming materials to be used in the light-sensitive recording material are not particularly limited, and various materials may be used. That is, the color image-forming materials include those which themselves are colored (e.g., dyes and pigments) and those which themselves are colorless or slightly colored, but which, when outer energy (heat, pressure, light irradiation, etc.) is applied thereto, or when in contact with another component (color developer), form color. Additionally, in the case of using a plurality of the above-described color image-forming materials, a color image may be easily formed by combining them with at least three compounds having light sensitivities in different spectrum regions which are capable of generating acid when irradiated respectively with three actinic radiations associated with them.

As dyes or pigments which themselves are colored, those described in various literature (for example, *Senryo Binran*, compiled by the Association of Organic Synthesis Chemistry and published in 1970), *Sai-shin Ganryo Binran*, compiled by the Japanese Pigment Technology Association and published in 1977) may be utilized, as well as commercially available dyes and pigments. These dyes or pigments are used as solutions or dispersions.

On the other hand, as materials which form color when some energy such as heat, pressure, or light irradiation is applied thereto, there are known thermochromic compounds, piezochromic compounds, photochromic compounds, and leuco-form triarylmethane dyes, quinone dyes, indigoid dyes, azine dyes, etc. All of these materials form color by one or more of heat, pressure, light irradiation, or air oxidation.

Examples of the materials which form color when in contact with another component include various systems of forming color by the reaction between two or more components, such as acid-based reaction, oxidation-reduction reaction, coupling reaction, chelate-forming reaction, etc. For example, known color-forming systems that may be utilized include pressure-sensitive copying paper described in Hiroyuki Moriga; *Nyumon Tokushushi No Kagaku* (published in 1975) (pp. 29 to 58), azography (pp. 87 to 95), and thermal color formation utilizing chemical change (pp. 118 to 120), color-forming systems described in the Preliminary Abstracts for the seminar of "Newest Dye Chemistry—Attractive Application and New Development as Functional Dyes", sponsored by the Society of Kinki Chemical Industry, pp. 26 to 32 (June 19, 1980), and the like may be utilized. Specifically, a color-forming system comprising a color former having a partial structure of lactone, lactam, spiro pyran, etc. and an acidic material (color developer) such as acid clay or a phenol; a system utilizing azo coupling reaction between an aromatic diazonium salt, a diazotate or a diazosulfonate and a naphthol, an aniline, an active methylene compound or the like; chelate-forming reaction between hexamethylenetetramine, ferric ion, and gallic acid, or between a phenolphthalein-complexon and an alkaline earth metal ion; oxidation-reduction reaction between ferric stearate and pyrogallol or between silver behenate and 4-methoxy-1-naphthol; and the like.

Such color formers include triarylmethane compounds, bisphenylmethane compounds, xanthene compounds, thiazole compounds, spiropyran compounds, etc. Typical examples thereof are Crystal Violet lactone, Benzoyl Leucomethylene Blue, Malachite Green lactone, p-Nitrobenzoyl Leucomethylene Blue, 3-dialkylamino-7-dialkylaminofluoran, 3-methyl-2,2'-spirobi(benzo-f-chrome), 3,3-bis(p-dimethylaminophenyl)phthalide, 3-(p-dimethylaminophenyl)-3-(1,2-dimethylindol-3-yl)phthalide, 3-(p-dimethylaminophenyl)-3-(2-methylindol-3yl)phthalide, 3-(p-dimethylaminophenyl)-3-(2-phenylindol-3-yl)phthalide, 3,3-bis(1,2-dimethylindol-3-yl)-5-dimethylaminophthalide, 3,3-bis-(1,2-dimethylindol-3-yl)-6-dimethylaminophthalide, 3,3-bis-(9-ethylcarbazol-3-yl)-5-dimethylaminophthalide, 3,3-bis-(2-phenylindol-3-yl)-5-dimethylaminophthalide, 3-p-dimethylaminophenyl-3-(1-methylpyrrol-2-yl)-6-dimethylaminophthalide, 4,4'-bis-dimethylaminobenzohydrin benzyl ether, N-halophenyl-leucoauramine, N-2,4,5-trichlorophenylleucoauramine, Rhodamine B anilinolactam, Rhodamine-(p-nitroanilino)lactam, Rhodamine B-(p-chloroanilino)lactam, 3-dimethylamino-6-methoxyfluoran, 3-diethylamino-7-methoxyfluoran, 3-diethylamino-7-chloro-6-methylfluoran, 3-diethylamino-6-methyl-7-anilinofluoran, 3-diethylamino-7-(acetylmethylamino)fluoran, 3-diethylamino-7-dibenzylamino)fluoran, 3-diethylamino-7-(methylbenzylamino)fluoran, 3-diethylamino-7-(chloroethylmethylamino)fluoran, 3-diethylamino-7-(diethylamino)fluoran, 3-methyl-spiro-dinaphthopyran, 3-ethyl-spiro-dinaphthopyran, 3,3'-dichloro-spiro-dinaphthopyran, 3-benzyl-spiro-dinaphthopyran, 3-methylnaphtho-(3-methoxybenzo)-spiropyran, 3-propyl-spirobenzoidopyran, etc.

If desired, mixtures of these color formers may be used. Fluoran type color formers disclosed in U.S. Pat. No. 3,920,510 may also be used in the present invention. Further, organic chemicals capable of reacting with heavy metal salts to form colored metal complexes, chelates, or salts may be used in the present invention.

As to various wall materials to be used for light-sensitive microcapsules of the present invention and the known techniques on microcapsules, noted are a technique of utilizing coacervation of hydrophilic wall-forming materials described in U.S. Pat. Nos. 2,800,457 and 2,800,458; a technique of interfacial polymerization described in U.S. Pat. No. 3,287,154 and British Pat. No. 990,443, and Japanese Patent Publication Nos. 19574/63, 446/67, and 711/67; a technique of precipitating polymer described in U.S. Pat. Nos. 3,418,250 and 3,660,304; a technique of using an isocyanate polyol wall-forming material described in U.S. Pat. No. 3,796,669; a technique of using an isocyanate wall-forming material described in U.S. Pat. No. 3,914,511; a technique of using a urea-formaldehyde type of urea-formaldehyde-resorcinol type wall-forming material described in U.S. Pat. Nos. 4,001,140, 4,087,376, and 4,089,802; a technique of using a wall-forming material such as a melamine-formaldehyde resin or hydroxypropylcellulose described in U.S. Pat. No. 4,025,455; an in situ technique of polymerizing monomers described in Japanese Patent Publication No. 9163/61 and Japanese Patent Application (OPI) No. 9079/76; a polymerizing, dispersing and cooling technique described in British Pat. Nos. 927,807 and 965,074; a spray-drying technique described in U.S. Pat. No. 3,111,407 and British Pat. No. 930,422; and the like. Microencapsulating techniques to be employed in the present invention are not limited to those above-described. However, it is particularly preferable to emulsify the core material containing components (a), (b), and (c) of the present invention and form a high molecular membrane as the outer shell of the microcapsules.

The microcapsules of the present invention have an average particle size of preferably from 0.5 to 50 $\mu$m, more preferably from 1 to 25 $\mu$m.

In preparing light-sensitive recording materials using the microcapsules of the present invention, the microcapsules are dispersed in a proper solvent to prepare a coating solution. Additionally, an aqueous solution containing the microcapsules obtained in the final step of the above-described preparation of the microcapsules may be used as such for preparing the coating solution. Other components may further be added to the coating solution. In the case of using the microcapsules retaining aqueous solution as such for preparing the coating solution, respective components of the light-sensitive recording material may be added before or after the above-described microencapsulating step.

Light-sensitive recording materials may be easily prepared by coating the thus prepared coating solution on various supports to be described hereinafter. Coating of the coating solution onto a support may be easily conducted in a conventional manner. That is, the coating solution is coated onto a support by a dip coating method, an air-knife coating method, a curtain coating method, a roller coating method, a doctor-knife coating method, a wire-bar coating method, a slide coating method, a gravure coating method, a extrusion coating method using a hopper as is described in U.S. Pat. No. 2,681,294, etc. If required, two or more layers may be simultaneously coated onto a support by a method as is described in U.S. Pat. Nos. 2,761,791, 3,508,947, 2,941,898 and 3,526,528, etc., and Yuji Harazaki, *Coating Engineering,* page 253, printed by Asakura Shoten, in 1973. According to coating amount and a desired coating speed, any coating methods can be used.

Supports for the light-sensitive recording material using the microcapsules of the present invention or an image-receiving material (to be described hereinafter) are not particularly limited. Examples of such materials include glass, paper, wood-free paper, coated paper, cast-coated paper, synthetic paper, metals and analogues, films of polyester, acetyl cellulose, cellulose ester, polyvinyl acetal, polystyrene, polycarbonate, polyethylene terephthalate, etc., papers laminated with a resin material or a polymer (e.g., polyethylene).

Binders to be used in the light-sensitive recording materials and image-receiving materials to be described hereinafter may be used alone or as a combination in the light-sensitive layer or an image-receiving layer (to be described hereinafter). As the binders, hydrophilic binders are mainly used. Transparent or semi-transparent binders are typical as the hydrophilic binders, and include natural materials such as proteins (e.g., gelatin, gelatin derivatives, etc.) and polysaccharides (e.g., cellulose derivatives, starch, gum arabic, etc.) and synthetic polymeric materials such as water-soluble polyvinyl compounds (e.g., polyvinyl alcohol, polyvinylpyrrolidone, acrylamide polymer, etc.). As other synthetic polymer materials, there are dispersed vinyl compounds in a latex form capable of increasing, particularly dimensional stability of photographic materials.

Layers that may be optionally provided in the light-sensitive recording material using the microcapsules of the present invention include an image-receiving layer, a heat-generating layer, a protective layer, an antistatic layer, an anti-curling layer, a peeling layer, a matting agent layer, etc.

In an embodiment wherein the light-sensitive recording material contains a color image-forming material in the microcapsules, the color image-forming material may be transferred to an image-receiving material to form color image. Such image-receiving material is constituted by an image-receiving layer functioning to immobilize the image-forming material released from the light-sensitive material and a support. It is also possible to coat the image-receiving layer as an optional layer of the light-sensitive material of the present invention as described above on the common support to the light-sensitive layer in place of using the image-receiving material.

The image-receiving layer may be constituted in an optional form using various compounds according to the color-forming systems of the aforementioned color image-forming materials. For example, in the case of using the color-forming system comprising a color former and a color developer, the color developer may be incorporated in the image-receiving layer. In addition, the image-receiving layer may be constituted by at least one mordant-containing layer. Appropriate mordants may be selected from among those compounds which are known in the photographic art taking into consideration the kinds of color image-forming materials used and the like. Additionally, the image-forming element may be constituted, if necessary, by two or more image-receiving layers using a plurality of mordants having different mordanting abilities. Where the image-receiving layer is positioned on the surface of the light-sensitive material or the image-receiving material, it is preferable to provide a protective layer.

The light sources of the actinic radiation to be used in the present invention include ones having energy in a range of an absorption wave-length of compound (c) and making compounds (c) release acid on an irradiation of the light sources, and preferably having energy in a range of preferably from 200 to 800 nm, more preferably from 250 to 500 nm, for example, a mercury lamp, a metal halide lamp, a xenon lamp, a chemical lamp, a carbon arc lamp, etc. In addition, scanning exposure using a high density energy beam (e.g., a laser beam or electron beam) may also be employed in the present invention. Sources for the laser beam include a helium½neon laser, argon laser, krypton ion laser, helium½cadmuim laser, etc.

Microcapsules of the present invention may find various uses by further incorporating specific materials. Such specific materials are not particularly limited, but organic or inorganic materials to be used as agricultural chemicals, foods, cosmetics, catalysts, adhesives, hardeners, oxidants, plasticizers, high polymeric coagulants, rust inhibitors, antioxidants, etc., may be incorporated in a solid or liquid state.

The light-sensitive material using the light-sensitive microcapsules of the present invention can be used for various applications, such as light-sensitive materials for photography or printing black-and-white or color images, printing light-sensitive materials, printing plates, X-ray light-sensitive materials, light-sensitive materials for medical use (for example, light-sensitive materials for photographing CRT image of ultrasonic wave diagnostic machine), light-sensitive materials for computer graphic hard copy, light-sensitive materials for a copying machine, etc.

The present invention is now illustrated in greater detail by reference to the following examples which, however, are not to be construed as limiting the present invention in any way.

EXAMPLE 1

(1) Preparation of microcapsules:

25 g of a vinyl compound of the present invention (I-32, wherein R is —$CH_3$), 0.1 g of 2,2'-azobis(2,4-dimethylvaleronitrile), 0.5 g of the compound of the present invention (IV-8), and 2 g of methyl ethyl ketone were placed in an ultrasonic wave dispersing machine to prepare a solution. To the resulting solution were added 8.7 g of a 3/1 addition product of tolylenediisocyanate and trimethylolpropane and 0.2 g of Crystal Violet lactone. This solution was emulsified and dispersed at 20° C. in a solution of 2.6 g of polyvinyl alcohol in 29 g of water to a size of 6 μm. After completion of the emulsification, 89 g of water was added thereto, and, while stirring, the temperature of the solution was raised to 80° C. After stirring for 1 hour, the solution was cooled. The thus obtained microcapsules were spray-dried to obtain a powdery product.

(2) Preparation of a developer-coated sheet:

100 g of sulfuric acid-processed acid clay was dispersed in 280 g of water containing 6 g of a 40% sodium hydroxide aqueous solution using a homogenizer. Then, 50 g of water containing 10 % of sodium salt of casein as a binder and 30 g of styrene-butadiene latex (trademark: Dow Latex 626, made by Dow Chemical Co.) were added thereto to prepare a color developer-containing coating solution. This coating solution was coated on a corona discharge-treated polyethylene terephthalate film in an amount of 7 g/m², then dried to obtain a color developer-coated sheet.

(3) Preparation of a light-sensitive material carrying microcapsules:

The aqueous coating obtained in (1) and containing 25% of microcapsules was coated on a corona discharge-treated polyethylene terephthalate film in an amount of 7 g/m², then dried to obtain a microcapsules-coated sheet.

This microcapsules-coated sheet was imagewise exposed using a mercury lamp (for 3 minutes using Atlas ultraviolet ray-irradiating apparatus).

This imagewise exposed sheet was superposed on the color developer-coated sheet, and a pressure of 150 Kg was applied thereto for ten seconds. Microcapsules in exposed areas were ruptured and the contents were transferred to the color developer-coated sheet. This was confirmed by the fact that unexposed areas were not colored, whereas exposed areas formed a distinct blue color image.

When two of the microcapsules-coated sheets obtained in (3) were superposed one over the other with the coated sides facing each other and rubbed against each other, followed by the imagewise exposure and pressure application in the same manner as described above, similarly distinct color images were obtained with no flaws. The result shows that since cores of microcapsules of the present invention are cured when microcapsules are coated on a support, the microcapsules-coated sheets hardly cause fog due to pressure.

EXAMPLE 2

A microcapsules-coated sheet was obtained in the same manner as in Example 1, except for using 22 g of Compound I-21 (wherein R is —H) in place of the compound of the present invention (I-32, wherein R is —CH₃) used in Example 1. In this case, the image was more distinct than that obtained in Example 1.

EXAMPLE 3

The microcapsules-containing solution obtained in Example 1, (1), was used as such without being subjected to spray-drying, and was coated on the developer-containing layer of the developer-coated sheet obtained in Example 1, (2), in an amount of 7 g/m², then dried to obtain a light-sensitive material having both a color developer layer and a microcapsules-containing layer.

This material was exposed in the same manner as in Example 1, and pressure applied thereto as in Example 1 to obtain a distinct blue image.

The microcapsules of the present invention permit provision of a microcapsules-containing layer on a color developer layer since the cores are in a cured state before exposure. Therefore, in comparison with the case of providing a color developer layer on microcapsules-containing layer, loss of exposure due to the color developer layer is avoided, thus recording materials having higher sensitivity can be obtained.

While the invention has been described in detail and with reference to specific embodiments thereof, it will be apparent to one skilled in the art that various changes and modifications can be made therein without departing from the spirit and scope thereof.

What is claimed is:

1. Microcapsules containing (a) a vinyl compound which has at least two polymerizable, ethylenically unsaturated groups linked to each other through a linking group comprising a chemical bond capable of being split by the action of an acid, (b) a thermal polymerization initiator, and (c) one or more compounds capable of producing acid when irradiated with actinic radiation.

2. Microcapsules as in claim 1, wherein the chemical bond capable of being split by the action of an acid is an acetal, and amido-acetal bond, an orthoester bond, a vinyl ether bond, a silyl ester bond, a silyl ether bond, a N-acylimino carbonic acid bond, a carbonic acid bond, a cumyl ester bond, a trityl ester bond, a silyl-oximether bond, or a borate bond.

3. Microcapsules as in claim 2, wherein said chemical bond is a silyl ester bond or a silyl ether bond.

4. Microcapsules as in claim 1, wherein said vinyl compound is a compound represented by formula (I) or (II)

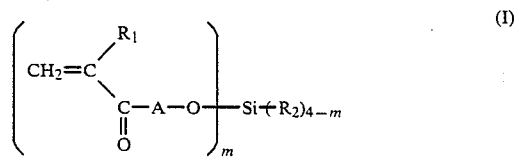

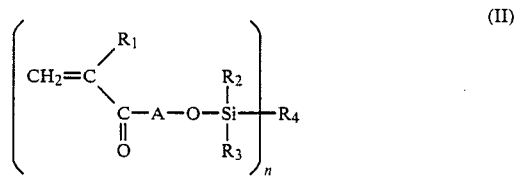

wherein R₁ represents a hydrogen atom, a halogen atom, or an unsubstituted or substituted alkyl group; R₂ and R₃ each represents a hydrogen atom, a substituted or unsubstituted alkyl, alkenyl, aryl, or aralkyl group, or —OR₅; R₄ represents an unsubstituted or substituted n-valent aliphatic or aromatic hydrocarbon; R₅ represents an unsubstituted or substituted alkyl, aryl, or aralkyl group; A represents a single chemical bond,

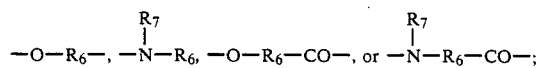

R₆ represents an unsubstituted or substituted divalent aliphatic or aromatic hydrocarbon; R₇ represents a hydrogen atom, an unsubstituted or substituted alkyl, aryl, or aralkyl group, or —CO—R₈; R₈ represents an unsubstituted or substituted alkyl, aryl, or aralkyl group; m represents an integer of from 2 to 4; and n represents an integer of 2 or more.

5. Microcapsules as in claim 4, wherein R₁ represents a hydrogen atom or an unsubstituted or substituted alkyl group; R₂ and R₃ each represents an unsubstituted or substituted alkyl, aryl, or aralkyl group; R₅ represents an alkyl group containing from 1 to 8 carbon atoms or an aryl group containing from 6 to 15 carbon atoms; R₇ represents a hydrogen atom, an alkyl group containing from 1 to 4 carbon atoms, or —CO—R₈; and R₈ represents an alkyl group containing from 1 to 4 carbon atoms or an aryl group containing from 6 to 10 carbon atoms.

6. Microcapsules as in claim 1, wherein said thermal polymerization initiator is at least one of an azo compound and peroxide compound.

7. Microcapsules as in claim 4, wherein said thermal polymerization initiator is at least one of an azo compound and peroxide compound.

8. Microcapsules as in claim 1, wherein said thermal polymerization initiator is used in an amount of from 0.01 to 10 wt %, based on the weight of said vinyl compound.

9. Microcapsules as in claim 7, wherein said thermal polymerization initiator is used in an amount of from 0.1 to 5 wt %, based on the weight of said vinyl compound.

10. Microcapsules as in claim 1, wherein the compound(s) capable of producing acid when irradiated with actinic irradiation is used in a molar ratio of from 0.0001/1 to 10/1 based on the molar content of said vinyl compound.

11. A light-sensitive recording material which has on its support microcapsules containing (a) a vinyl compound represented by formula (I) or (II)

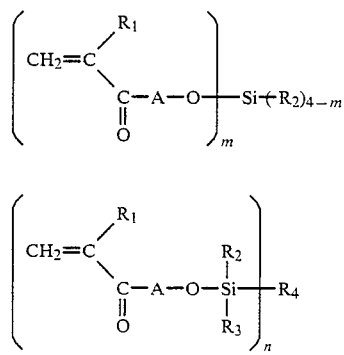

wherein $R_1$ represents a hydrogen atom, a halogen atom, or an unsubstituted or substituted alkyl group; $R_2$ and $R_3$ each represents a hydrogen atom, a substituted or unsubstituted alkyl, alkenyl, aryl, or aralkyl group, or $-OR_5$; $R_4$ represents an unsubstituted or substituted n-valent aliphatic or aromatic hydrocarbon; $R_5$ represents an unsubstituted or substituted alkyl, aryl, or aralkyl group; A represents a single chemical bond, $$-O-R_6-, -N-R_6, -O-R_6-CO-, \text{ or } -N-R_6-CO-;$$
$$\phantom{-O-R_6-, }\,^{R_7}\phantom{-N-R_6, -O-R_6-CO-, \text{ or }}\,^{R_7}$$

$R_6$ represents an unsubstituted or substituted divalent aliphatic or aromatic hydrocarbon; $R_7$ represents a hydrogen atom, an unsubstituted or substituted alkyl, aryl, or aralkyl group, or $-CO-R_8$; $R_8$ represents an unsubstituted or substitited alkyl, aryl, or aralkyl group; m represents an integer of from 2 to 4; and n represents an integer of 2 or more, (b) a thermal polymerization initiator, and (c) one or more compounds capable of producing acid when irradiated by actinic radiation, or a thermally cured product of said microcapsules.

12. A light-sensitive recording material as in claim 11, wherein $R_1$ represents a hydrogen atom or an unsubstituted or substituted alkyl group; $R_2$ and $R_3$ each represents an unsubstituted or substituted alkyl, aryl, or aralkyl group; $R_5$ represents an alkyl group containing from 1 to 8 carbon atoms or an aryl group containing from 6 to 15 carbon atoms; $R_7$ represents a hydrogen atom, an alkyl group containing from 1 to 4 carbon atoms, or $-CO-R_8$; and $R_8$ represents an alkyl group containing from 1 to 4 carbon atoms or an aryl group containing from 6 to 10 carbon atoms.

13. A light-sensitive recording material as in claim 11, wherein said thermal polymerization initiator is at least one of an azo compound and peroxide compound.

14. A light-sensitive recording material as in claim 11, wherein said thermal polymerization initiator is at least one of an azo compound and peroxide compound.

15. A light-sensitive recording material as in claim 11, wherein said thermal polymerization initiator is used in an amount of from 0.01 to 10 wt %, based on the weight of said vinyl compound.

16. A light-sensitive recording material as in claim 14, wherein said thermal polymerization initiator is used in an amount of from 0.1 to 5 wt %, based on the weight of said vinyl compound.

17. A light-sensitive recording material as in claim 11, wherein the compound(s) capable of producing acid when irradiated with actinic irradiation is used in a molar ratio of from 0.0001/1 to 10/1 based on the molar content of said vinyl compound.

* * * * *